United States Patent [19]

Ishigaki et al.

[11] Patent Number: 4,532,475

[45] Date of Patent: Jul. 30, 1985

[54] IMPULSE NOISE REDUCTION BY LINEAR INTERPOLATION HAVING A DEEMPHASIS CHARACTERISTIC

[75] Inventors: Yukinobu Ishigaki, Tokyo; Kazutoshi Hirohashi, Yokohama, both of Japan

[73] Assignee: Victor Company of Japan, Limited, Japan

[21] Appl. No.: 585,925

[22] Filed: Mar. 2, 1984

[30] Foreign Application Priority Data

Mar. 9, 1983 [JP] Japan .................................. 58-38467
Mar. 14, 1983 [JP] Japan .................................. 58-42069

[51] Int. Cl.³ ............................................. H03B 1/04
[52] U.S. Cl. .................................... 328/165; 330/149; 455/223
[58] Field of Search ................ 330/149; 328/162–165; 455/303, 312, 223; 375/104; 381/94

[56] References Cited

U.S. PATENT DOCUMENTS 4,305,042 12/1981 Tanaka et al. .................. 328/165 X
4,311,963 1/1982 Watanabe et al. .............. 328/165 X Primary Examiner—James B. Mullins
Attorney, Agent, or Firm—Lowe, King, Price & Becker

[57] ABSTRACT

An analog audio signal having a high frequency preemphasis is applied to a sampling pulse generator (2) which generates a sampling pulse in response to an impulse noise introduced to the signal and also to a sample-hold and deemphasis circuit (5; 50) which deemphasizes the audio signal when impulse noise is nonexistent and holds the signal in the presence of the sampling pulse. A differentiator (6) derives a signal representative of the slope ratio of the analog signal from the deemphasized signal. A sample-and-hold circuit (7) samples the slope ratio signal in response to the sampling pulse and applies it to a charging and discharging circuit (8; 503) which performs linear charging and discharging of the capacitor (55; 505) at a rate variable as a function of the sampled signal to reconstruct the portion of the signal lost during the sampling period.

6 Claims, 5 Drawing Figures

IMPULSE NOISE REDUCTION BY LINEAR INTERPOLATION HAVING A DEEMPHASIS CHARACTERISTIC

RELATED COPENDING APPLICATION

The present application is related to Copending U.S. Pat. Application No. 517,985, filed July 29, 1983 invented by Y. Ishigaki, assigned to the same assignee as the present invention, and titled "Circuit Arrangement for Reconstructing Noise-Affected Signals".

BACKGROUND OF THE INVENTION

The present invention relates generally to noise reduction, and in particular to a noise reduction circuit which eliminates impulse noise that occurs in audio signals using a linear interpolation technique immune to white noise. The invention is particularly useful for applications where the audio signal level is relatively low in comparison with the white noise level.

One method currently available for suppressing impulse noise that contaminates audio signals involves reducing the transmission gain or shutting off the transmission path of the signal as long as the noise is present. Another method involves detecting the amplitude of the wanted signal on the rising edge of an impulse noise and retaining the detected amplitude in the presence of the impulse noise. While these methods are effective in suppressing impulse noise, the noise-affected portion of the signal is not reconstructed, resulting in unnatural sound. To overcome this problem modern digital audio systems utilize linear interpolation technique to predict the original waveform of the noise-affected portion by linear interpolation. This type of systems requires complicated, expensive circuitry, not suitable for moderate cost equipments.

The aforesaid copending U.S. application discloses an impulse noise reduction circuit for an audio signal whose high frequency components are preemphasized. The signal is passed through a first deemphasis circuit which partially deemphasizes the signal and through a first sample-and-hold circuit which tracks the waveform of the signal when no impulse noise is present and holds the signal level in response to the impulse noise, while at the same time cutting off the transmission path of the noise reduction circuit. The output of the first sample-and-hold circuit is applied on the one hand to a second deemphasis circuit thence to the output terminal and on the other hand to a feedback circuit which includes a differentiator. The deemphasis circuit coacts with the first deemphasis circuit to provide a deemphasis characteristic complementary to the preemphasis characteristic. The slope ratio of the audio signal is detected by the differentiator and sampled by a second sample-and-hold circuit in response to that impulse noise as an indication of the position of the noise of interest in the audio signal waveform. The sampled signal drives a voltage-controlled bidirectional constant current source to linearly vary the voltage sampled by the first sample-and-hold by performing linear charging and discharging of the capacitor thereof.

Since the input signal to the differentiator is not arranged to pass through the second deemphasis circuit, the white noise is present in that input signal and detected by the differentiator so that it accenturates the white noise, resulting in an error in the interpolation voltage.

SUMMARY OF THE INVENTION

Therefore, the primary object of the invention is to provide an inexpensive impulse noise reduction circuit using a linear interpolation technique which is immune to white noise.

The invention provides a noise reduction circuit which comprises a sampling circuit for generating a sampling pulse in response to an impulse noise introduced to an analog input signal. A first sample-and-hold circuit is coupled in a signal transmissin path from input to output terminals. In tracking modes wherein the impulse noise is nonexistent, the first sample-and-hold follows the waveform of the audio signal. In response to an impulse noise, the first sample-and-hold is triggered by the sampling pulse to sample the audio signal into a storage capacitor. A nonlinear transfer circuit is provided having a nonlinear input-output characteristic for suppressing small amplitude signals including white noise. The transfer circuit is connected from the output of the first sample-and-hold to a differentiator. The slope ratio of the white-noise free audio signal is detected by the differentiator and applied to a second sample-and-hold circuit which is also responsive to the sampling pulse for sampling the slope ratio signal. A voltage-controlled bidirectional constant current source is connected to the storage capacitor and is responsive to the sampled slope ratio signal for performing the linear charging and discharging of the capacitor to vary the voltage stored therein.

By the provision of the nonlinear transfer circuit the acoustophysiological effect of the above noted interpolation distortion is satisfactorily reduced.

Preferably the impulse noise reduction circuit includes a low-pass filter for passing the lower frequency components of the signal from the first sample-and-hold circuit direct to an adder and a high-pass filter for passing the higher frequency components through the nonlinear transfer circuit to the adder whose output is supplied as an input to the differentiator.

BRIEF DESCRIPTION OF THE DRAWINGS

The present invention will be described in further detail with reference to the accompanying drawings, in which.

DETAILED DESCRIPTION

Figure 1:
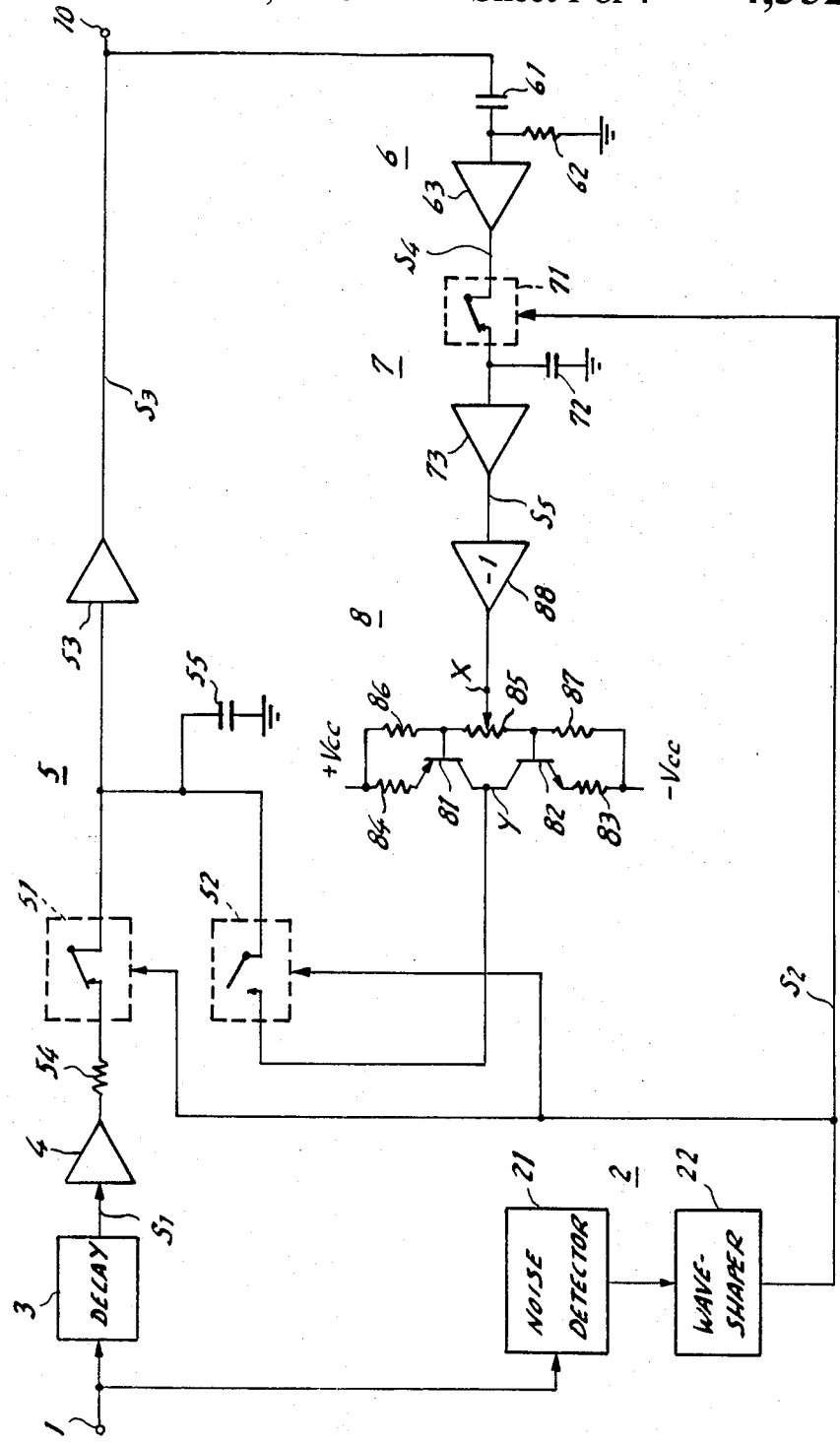
FIG. 1 is a block diagram of a first embodiment of the present invention.

Referring now to FIG. 1, there is shown a noise reduction circuit according to a first embodiment of the present invention. The noise reduction circuit generally comprises a sampling pulse generator 2, a sample-hold and deemphasis circuit 5, a differentiator 6, a sample-and-hold circuit 7 and a voltage-controlled bidirectional constant current source 8.

A high-frequency-preemphasized audio input signal is applied through an input terminal 1 to a sampling pulse generator 2 and to a delay circuit 3. The sampling pulse generator 2 includes a noise detector 21 and a waveshaper 22. The noise detector 21 generates an output in response to an impulse noise which is in the form of bursts of short duration contained in a high-frequency preemphasized audio signal which is applied to an input terminal 1. The waveshaper 22 shapes the detector 21 output into a rectangular sampling pulse.

The audio signal is delayed by the delay circuit 3 so that it coincides with the sampling pulse and amplified by a buffer amplifier 4 and fed to the sample-hold and deemphasis circuit 5. The circuit 5 comprises a resistor 54 which is coupled through a normally closed analog switch 51 and a capacitor 55 to ground to form a deemphasis circuit having a complementary characteristic to that with which the audio signal has been preemphasized. The junction between the switch 51 and capacitor 55 is coupled by way of a buffer amplifier 53 having a high input impedance to an output terminal 10. This junction is further coupled by way of a normally open analog switch 52 to the output of the constant current source 8 which performs the linear charging and discharging of the capacitor 55.

In a manner as will be described the noise reduction circuit operates in a tracking-and-deemphasis mode when impulse noise is nonexistent in the input signal and operates in a sample-and-hold mode in response to the detection of the noise.

The sampling pulse from the waveshaper 22 is applied to the normally closed switch 51 for cutting off the transmission path of the audio signal from the input terminal 1 to output terminal 10 to prevent the noise from being delivered to the output terminal 10 and for generating a linear interpolating voltage in the capacitor 55 to reconstruct the cutoff portion of the signal. The sampling pulse is also applied to the normally open switch 52 to complete the circuit from the output of constant current source 8 to the capacitor 55 during the sample-and-hold mode.

During tracking and deemphasis modes, the switch 51 remains closed and the voltage developed in the capacitor 55 follows the waveform of the audio input which is amplified by the buffer 53 for delivery to the output terminal 10 while it coacts with the resistor 54 to provide high-frequency deemphasis. The white noise which prevails in the high frequency region of the audio spectrum is thus attenuated to a low level insufficient for it to be detected by the differentiator 6, while at the same time deemphasizing the preemphasized larger amplitude signals.

The sample-and-hold mode commences in response to the sampling pulse generated upon the detection of an impulse noise. The switch 51 opens and the capacitor 55 holds the voltage which was stored therein at the time immediately prior to the occurrence of the noise. The switch 52 closes in response to that sampling pulse to connect the output of the charging and discharging circuit 8 to the capacitor 55.

The capacitor 55 voltage is coupled through amplifier 53 to the differentiator 6 comprising a capacitor 61, a resistor 62 and a buffer amplifier 63. The output of the differentiator 6 represents the slope ratio of the audio signal so that the differentiator 6 output is an indication of the position of the noise impulse on the varying slope of the audio signal. The slope ratio signal is applied to the sample-and-hold circuit 7 which comprises a normally closed analog switch 71, a capacitor 72, and a buffer amplifier 73. The switch 71 is responsive to the sampling pulse to sample the slope ratio signal into the capacitor 72 so that the sampled voltage represents the slope ratio of the audio signal immediately prior to the occurrence of the impulse noise.

The voltage-controlled bidirectional constant current source 8 comprises a pair of transistors 81 and 82 of opposite conductivity types connected in series between a positive voltage supply +Vcc and a negative voltage supply −Vcc through resistors 83 and 84, respectively. The transistors 81 and 82 are biased by potentials developed at opposite terminals of a potentiometer 85 which are connected respectively to the voltage sources through resistors 86 and 87. The collectors of transistors 81 and 82 are coupled together to the capacitor 6 and the tap point of the potentiometer 85 is connected to the output of the sample-and-hold circuit 12 by way of a unity gain inverting amplifier 88. The potentiometer 85 is so adjusted that for a zero-volt setting at a node X a corresponding zero volt potential appears at a node Y.

The operation of this constant current source is such that when a positive input potential is applied thereto the transistor 81 is rendered more conductive than is transistor 82 and supplies more current to the node Y than the current drained therefrom by transistor 82. As a result, the node Y is driven to a positive potential equal to the potential developed at node X. The capacitor 55 is thus charged linearly at a rate proportional to the amplitude of the positive-going input pulse. A negative input potential, on the other hand, renders the transistor 82 more conductive than transistor 81 to drain more current from the node Y than the current supplied thereto through transistor 81, so that the node Y is driven to a negative potential equal to the potential at node X. The capacitor 55 is thus discharged linearly at a rate proportional to the amplitude of the negative going pulse.

The slope ratio signal sampled by the sample-and-hold circuit 7 drives the constant current source 8 to cause it to charge or discharge the capacitor 55 depending on the polarity of the sampled signal and at a linear rate variable as a function of the sampled value. Therefore, if the noise occurs on an uphill slope of the audio signal, the sampled signal is of positive polarity and its value represents the gradient of the position of the uphill slope on which the noise is present. The constant current source 8 supplies a current to the capacitor 55 in proportion to the sampled value so that the capacitor 55 voltage increases linearly until the end of the sampling period at the same rate as the signal was increasing at the point immediately prior to the occurrence of the noise, thus developing an interpolation voltage which approximates the lost portion of the signal. If the noise occurs on a downhill slope, on the other hand, the sampled signal is of negative polarity and the current source 8 drains a current from the capacitor 55 so that the capacitor 55 voltage decreases linearly until the end of the sampling period at the same rate as the signal was decreasing at the point immediately prior to the occurrence of the noise.

Since the white noise has been removed by the resistor 54 and capacitor 55 during tracking mode, the differentiator 6 provides no undesirable output which would otherwise be sampled into the capacitor 72. The interpolation distortion is thus avoided.

Figure 2:
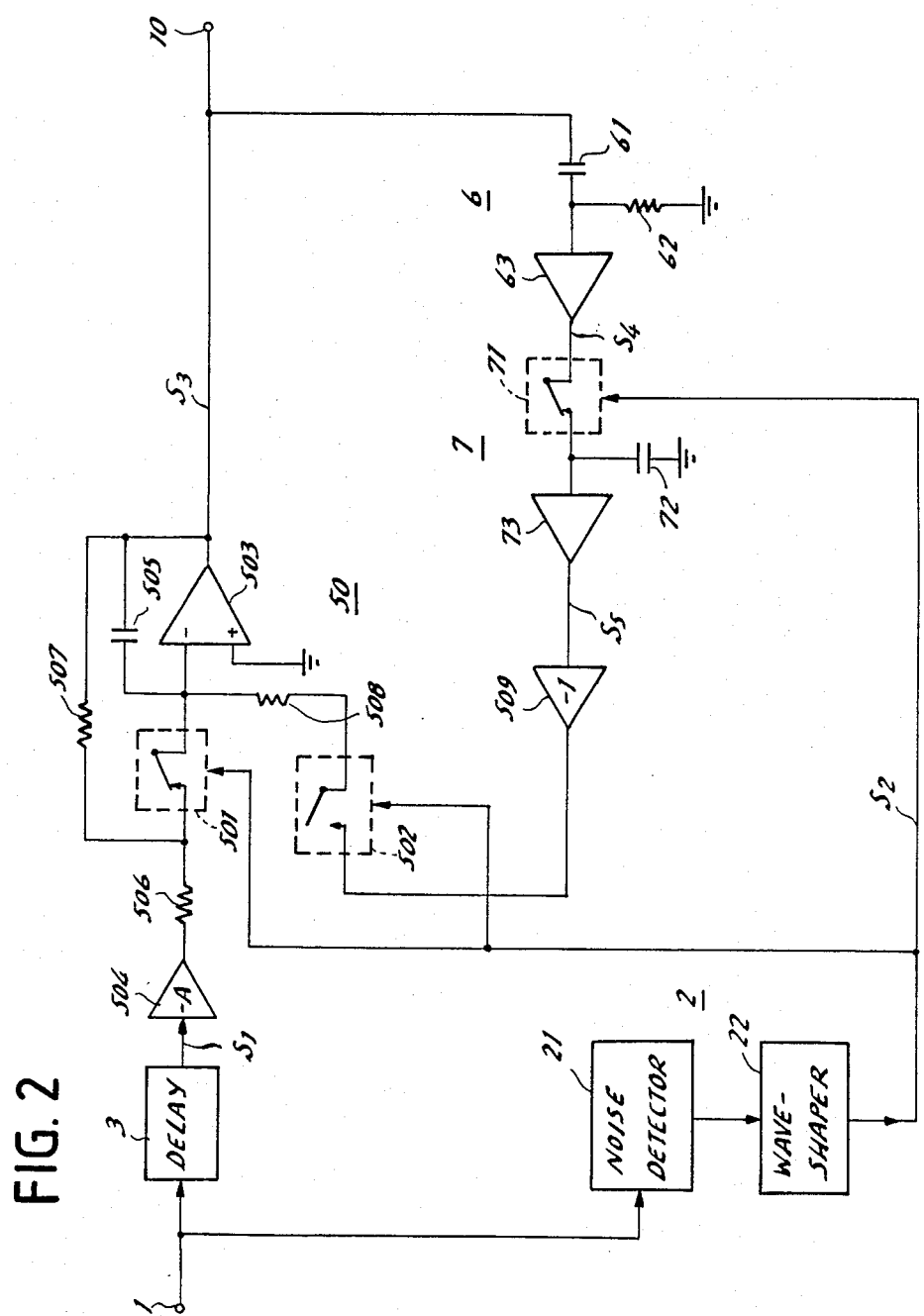
FIG. 2 is a block diagram of a second embodiment of the present invention.

FIG. 2 is an illustration of a second embodiment of the present invention in which parts corresponding to those of FIG. 1 are marked with the same numerals as in FIG. 1. The second embodiment includes an integration and deemphasis circuit 50 which replaces the sample-hold and deemphasis circuit 5 and voltage-controlled bidirectional constant current source 8 of the previous embodiment.

The integrator and deemphasis circuit 50 includes a differential amplifier 503 having a noninverting input coupled to ground and an inverting input coupled through a normally closed switch 501 to one end of a resistor 506 the other end of which is coupled to the output of an inverting amplifier 504 having an inverting gain A. A feedback capacitor 505 is coupled from the output of the differential amplifier 503 to its inverting input and a feedback resistor 507 is coupled from the amplifier 503 output to the inverting input through the switch 501. The inverting input of the differential amplifier 503 is impressed with a signal supplied from the sample-and-hold circuit 7 through a unity gain inverting amplifier 509 and through a normally open switch 502 and a resistor 508 when the switch 502 is operated in response to the sampling pulse. The switch 501 is responsive to the sampling pulse to open the circuit to the inverting input of differential amplifier 503.

Figure 3A:
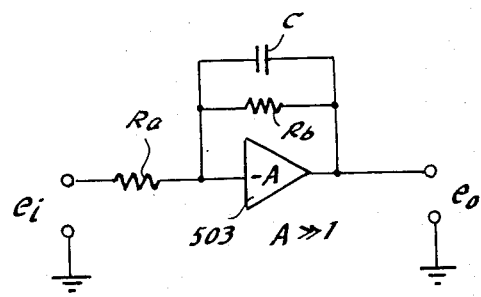
FIGS. 3A and 3B are illustrations of the integrator/-deemphasis circuit of FIG. 2 in different circuit conditions.

During tracking and deemphasis modes, the switch 501 remains closed so that the integrator and deemphasis circuit 50, as represented by FIG. 3a, has a deemphasis characteristic which is given by a transfer function G(S) as follows:

$$G(S) = \frac{e_o}{e_i} = -\frac{Rb}{Ra} \times \frac{1}{S.C.Rb + 1} \quad (1)$$

where,
Ra = resistance of resistor 506
Rb = resistance of resistor 507
C = capacitance of capacitor 505
S = jω.

The deemphasis characteristic given by Equation 1 deemphasizes the higher frequency components of the audio signal in a manner complementary to the preemphasis given to the audio signal and the white noise is thus eliminated prior to application to the differentiator 6.

Figure 3B:
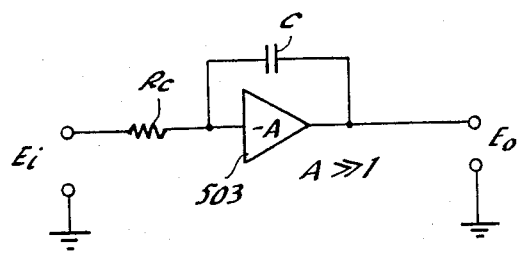

During sample-and-hold modes, the switch 501 opens and switch 502 closes in response to the sampling pulse. The integrator and deemphasis circuit 50 acts as a Miller integrator shown in FIG. 3b whose transfer function is given by:

$$G(S) = \frac{Eo}{Ei} = \frac{1}{S.c.Rc} \quad (2)$$

where Rc = resistance of resistor 508. The slope ratio signal sampled into the capacitor 72 is impressed on the differential amplifier 503 through resistor 508 so that the it linearly charges or discharges the capacitor 505 depending on the polarity of the sampled signal at a rate corresponding to the sampled value.

Figure 4:
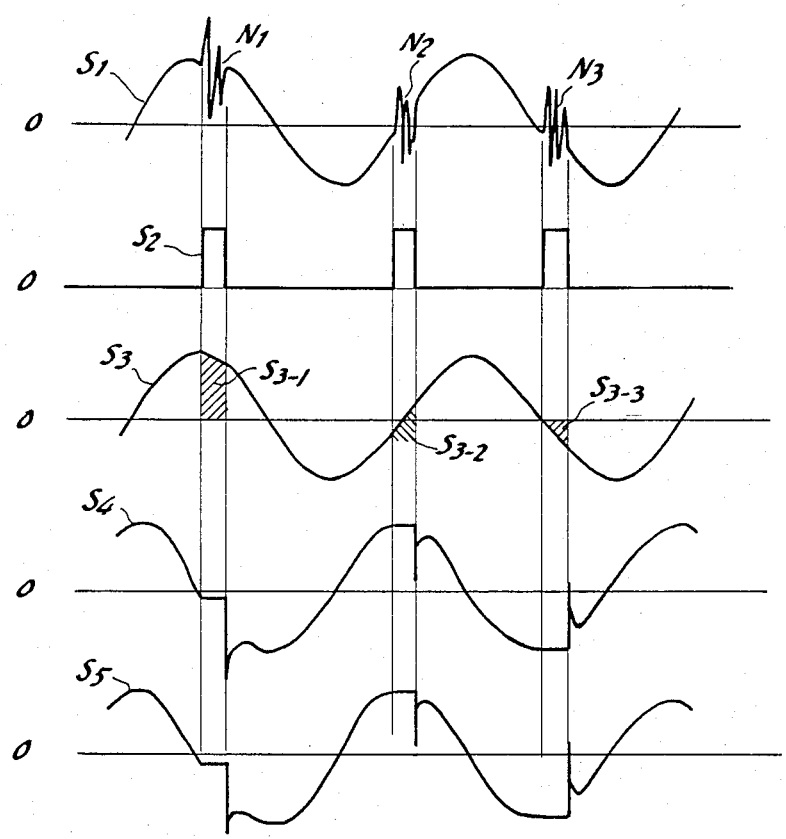
FIG. 4 is an illustration of the waveform appearing at various points of the embodiments of FIGS. 1 and 2.

FIG. 4 is an illustration of waveforms appearing at various points of the embodiments of FIGS. 1 and 2. For purposes of illustration, impulse noises $N_1$, $N_2$ and $N_3$ are assumed to occur in the preemphasized audio signal $S_1$ at different slope portions of the audio waveform. Sampling pulses $S_2$ are generated by the sampling pulse generator 2 in time-coincident with the noises to operate the switches 51 and 501, truncating the signal $S_3$ as indicated at $S_{3-1}$, $S_{3-2}$ and $S_{3-3}$. The output signal $S_4$ of the differentiator 6 is sampled at the leading edge of the sampling pulses so that the slope ratio signal is retained at a constant level during the sampling periods as shown at $S_5$ and charges the capacitors 55 and 505 linearly at a rate proportional to the sampled value. The truncated portions of the signal $S_3$ are reconstructed by the voltage developed in the capacitor. Due to this linear charging and discharging operation, the truncated portion of the signal varies linearly at the same rate as the signal was varying at the instant immediately prior to the occurrence of the noise. The output signal $S_4$ of the differentiator thus remains constant during the sampling period and assumes the same waveform as the output of the sample-and-hold circuit 7.

The foregoing description shows only preferred embodiments of the present invention. Various modifications are apparent to those skilled in the art without departing from the scope of the present invention which is only limited by the appended claims. Therefore, the embodiments shown and described are only illustrative, not restrictive.

What is claimed is:

1. A noise reduction circuit having an input terminal to which a high-frequency preemphasized analog audio signal is applied and an output terminal from which a noise-suppressed audio signal is delivered, comprising:
   means coupled to said input terminal for generating a sampling pulse in response to an impulse noise introduced to said analog signal;
   means having a resistor and a capacitor connected in a signal transmission path between said input terminal and said output terminal for deemphasizing said audio signal in the absense of said sampling pulse and disconnecting said transmission path at a point between said input terminal and said capacitor in the presence of said sampling pulse;
   a differentiator coupled to the output of said deemphasis circuit for generating a signal representative of the slope ratio of the deemphasized analog signal;
   a sample-and-hold circuit coupled to the output of the differentiator for sampling said slope ratio signal in response to said sampling pulse; and
   means for linearly charging and discharging said capacitor at a rate variable as a function of the sampled signal in the presence of said sampling pulse.

2. A noise reduction circuit as claimed in claim 1, wherein said deemphasizing means includes a normally closed switch means connected in said signal transmission path for disconnecting the same in response to said sampling pulse at a point between said input terminal and said capacitor.

3. A noise reduction circuit as claimed in claim 1, wherein said charging and discharging means comprises a voltage-controlled bidirectional constant current source and a normally open switch means for coupling the output of said current source to said capacitor in response to said sampling pulse.

4. A noise reduction circuit as claimeed in claim 3, wherein said constant current source comprises a pair of transistors of opposite conductivity types connected in a series circuit between voltage supplies of opposite polarities, and a resistor network for biasing said transistors in response to the output signal from said second sample-and-hold circuit, a junction between said transistors being coupled to said capacitor.

5. A noise reduction circuit as claimed in claim 1, wherein said charging and discharging means and said deemphasizing means are formed by a circuit comprising:

an amplifier having inverting and noninverting inputs, the noninverting input being coupled to a reference potential and the output of the amplifier being coupled to said output terminal;

normally closed switch means responsive to said sampling pulse to open a circuit path;

a first resistor by which said input terminal is coupled to the inverting input of said operational amplifier;

a second resistor by which the output of said operational amplifier is coupled to the inverting input through said normally closed switch means;

a capacitor by which the output of said operational amplifier is coupled to the inverting input thereof; and normally open switch means responsive to said sampling pulse to complete a circuit path; and a third resistor by which the output of said sample-and-hold circuit is coupled to said inverting input through said second switch means.

6. A noise reduction circuit as claimed in claim 1, further comprising a buffer amplifier having a high input impedance coupled in said signal transmission path between said capacitor and said output terminal.

* * * * *